United States Patent
Steenkiste et al.

(10) Patent No.: US 6,758,958 B1
(45) Date of Patent: Jul. 6, 2004

(54) SYSTEM AND A METHOD FOR PLATING OF A CONDUCTIVE PATTERN

(75) Inventors: Filip Van Steenkiste, Machelen (BE); Kris Baert, Leuven (BE); Walter Gumbrecht, Herzogenaurach (DE); Philippe Arquint, Herzogenaurach (DE)

(73) Assignees: Interuniversitair Micro-Elektronica Centrum, Leuven (BE); Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/744,465
(22) PCT Filed: Jul. 14, 1999
(86) PCT No.: PCT/BE99/00090
§ 371 (c)(1),
(2), (4) Date: Apr. 16, 2001
(87) PCT Pub. No.: WO00/07229
PCT Pub. Date: Feb. 10, 2000

Related U.S. Application Data
(60) Provisional application No. 60/093,974, filed on Jul. 24, 1998.

(51) Int. Cl.[7] .............................. C25D 5/02; H01R 12/00
(52) U.S. Cl. ...................... 205/118; 205/123; 205/125; 205/205; 428/901; 439/55
(58) Field of Search .............................. 205/118, 123, 205/133, 157, 205, 220, 125; 428/545, 901; 439/55, 78

(56) References Cited

U.S. PATENT DOCUMENTS

| | | | |
|---|---|---|---|
| 4,939,568 A | | 7/1990 | Kato et al. .................. 257/686 |
| 5,000,827 A | * | 3/1991 | Schuster et al. ............ 205/118 |
| 5,483,741 A | * | 1/1996 | Akram et al. ................ 29/846 |
| 5,726,075 A | * | 3/1998 | Farnworth et al. ............ 438/18 |

FOREIGN PATENT DOCUMENTS

| | | |
|---|---|---|
| DE | 28 30 761 A1 | 1/1980 |
| EP | 780 890 A1 | 6/1997 |
| FR | 1555930 | 1/1968 |
| JP | 57153431 | 9/1982 |
| JP | 60128615 | 7/1985 |

* cited by examiner

*Primary Examiner*—Nam Nguyen
*Assistant Examiner*—Brian Mutschler
(74) *Attorney, Agent, or Firm*—Knobbe Martens Olson & Bear LLP

(57) ABSTRACT

The invention presents methods and systems for plating conductive patterns which at least result in a high uniformity and avoid parasitical plating effects. A plating system is disclosed for plating conductive patterns formed at a first surface of a substrate. The system is such that exposure surfaces not to be plated is inhibited. A first electrode of the system is immersed in the plating solution while the second electrode is in contact with another than the first surface of the substrate. The conductive patterns to be plated are temporarily electrically connected with the second electrode.

6 Claims, 3 Drawing Sheets

SYSTEM AND A METHOD FOR PLATING OF A CONDUCTIVE PATTERN

This application is a National Stage Application of PCT/BE99/00090, filed on Jul. 14, 1999, which claims the benefit of U.S. Provisional Patent Application No. 60/093,974, filed on Jul. 24, 1998.

FIELD OF THE INVENTION

The invention relates to methods and systems for plating conductive patterns.

TECHNOLOGICAL BACKGROUND

In the solid state electronics industry, a plurality of components being active devices as well as passive devices are processed on a surface of a semiconductor wafer for instance to form an integrated circuit. To form these integrated circuits metallization structures are requested both as a part of the aforementioned devices and to interconnect these devices. The formation of such metallization structures includes the plating of a conductive pattern, being part of a metallization structure and being formed at a first surface of a substrate, such as a wafer. Particularly this first surface can be the front side or the back side of the wafer.

One of the issues involved is the plating of this first surface of a substrate without exposing a second surface of a wafer, opposite to the first surface, to a plating solution. Particularly, exposure, even partly, would result in unwanted wetting, plating and/or corroding of other surfaces. Furthermore to be able to deposit a material by electroplating, the plating solution must be in contact with the first surface of the substrate comprising the conductive patterns to be plated and two electrically connectable electrodes have to be provided. Usually, the first electrode is immersed in the plating solution, while the second electrode has to be electrically connected to the conductive patterns to be plated. State-of-the-art plating techniques usually contact peripheral regions of the first surface of a substrate, comprising the conductive patterns to be plated. These peripheral contact regions are electrically connected to the second electrode as well as to the conductive patterns to be plated.

A problem is that often long metal lines are required to connect each conductive pattern to be plated with the contact in the peripheral region. Particularly, this is a problem when one wants to perform plating on wafer scale because the differences in distance between conductive patterns to be plated being located near the edges of the wafer and in the center of the wafer are huge. These differences are typically in the centimeter range. Consequently also the differences in resistance of the metal lines connecting the respective conductive patterns can be huge. This often results in a highly non-uniform plating process. All these metal connections between the conductive patterns to be plated and the peripheral regions can not be easily removed after the plating process and moreover, a lot of wafer-area is required to provide these connections thereby inhibiting dense integration. Another problem is that the contact means in the peripheral regions are exposed to the plating solution. These contact means become parasitically plated and have to be cleaned regularly. A further problem can arise if the contact means do not simultaneously can be used as sealing means, then extra sealing means are required. These sealing means should then be positioned between the contact means and the edges of the wafer in order to avoid leakage of the plating solution to another surface of the wafer. Consequently, this leads again to a further decrease of the available area which can be plated.

AIM OF THE INVENTION

The invention presents methods and systems for plating conductive patterns which at least result in a high uniformity and avoid parasitical plating effects.

SUMMARY OF THE INVENTION

In an aspect of the invention a plating system is disclosed for plating on a plurality of conductive patterns formed at a surface of a substrate. A plating solution is applied on this surface and the exposure of other surfaces of the substrate to the plating solution is inhibited. A first electrode of the system is immersed in the plating solution while the second electrode is in contact with another surface of the substrate. The conductive patterns to be plated are temporarily electrically connected with the second electrode resulting in a uniform and selective deposition over the exposed surface of the substrate. Particularly, according to this aspect of the invention, a system is disclosed for plating on at least one conductive pattern, said conductive pattern being positioned at a first surface of a substrate having at least a first surface and a second surface, said system comprising:

a support with an electrically connectable electrode thereon;

a sealing element to inhibit the exposure of the second surface of the substrate to a plating solution; and wherein said substrate is placeable on said support such that said electrode is in contact with said second surface of said substrate and wherein a contact to said first surface of said substrate is provided, said conductive pattern being temporarily electrically connected with said contact and said contact being electrically connected with said electrode.

In another aspect of the invention, a substrate is disclosed having at least a first surface and a second surface opposite to said first surface, said first surface being exposable to a plating solution, said substrate comprising a conductive pattern being positioned at said first surface of a substrate;

a contact to the first surface of the substrate; and said conductive pattern being temporarily electrically connected by a polysilicon or an amorphous silicon conductor with said contact and said contact being electrically connected with said second surface.

In a further aspect of the invention, a method is disclosed for plating on at least one conductive pattern formed at a surface of a substrate, said substrate having at least a first surface and a second surface, said method comprising the steps of:

placing the substrate on an electrode being part of a plating holder such that said second surface of said substrate is in contact with said electrode and said conductive pattern is temporarily electrically connected to said conductive pattern; and applying a plating solution on said first surface of said substrate thereby inhibiting exposure of said second surface to said plating solution.

DESCRIPTION OF THE INVENTION

Figure 1:
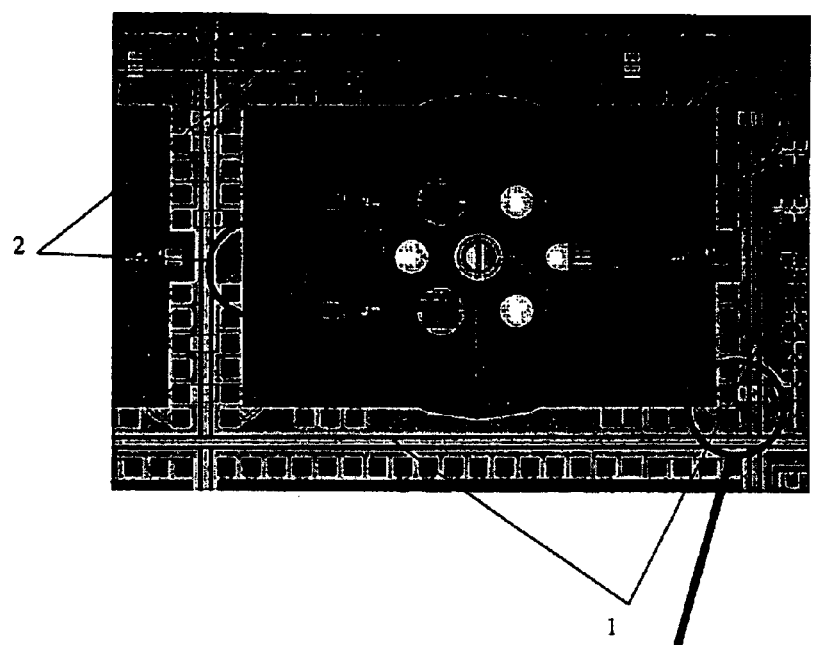
FIG. 1 shows a plurality of structures to be plated. Each one of said plurality of structures (with boundary (2)) is connected to a polysilicon stripe which crosses the dicing line (1).

In an aspect of the invention a plating system is disclosed for plating on a plurality of conductive patterns formed at a surface of a substrate. A plating solution is applied on this surface and the exposure of other surfaces of the substrate to the plating solution is inhibited. A first electrode of the system is immersed in the plating solution while the second electrode is in contact with another surface of the substrate. The conductive patterns to be plated are temporarily electrically connected with the second electrode resulting in a uniform and selective deposition over the exposed surface of the substrate. Particularly, according to this aspect of the invention, a system is disclosed for plating on at least one conductive pattern, said conductive pattern being positioned at a first surface of a substrate having at least a first surface and a second surface, said system comprising:
   a support with an electrically connectable electrode thereon (8);
   a sealing element (6) to inhibit the exposure of the second surface of the substrate to a plating solution; and
   where said substrate is placeable on said support such that said electrode (8) is in contact with said second surface of said substrate and wherein a contact to said first surface of said substrate is provided, said conductive pattern being temporarily electrically connected with said contact (10) and said contact being electrically connected with said electrode. Particularly, the electrical connection between the contact at the first surface of the substrate and the electrode at the second surface of the substrate can be a doped semi-conductive region of either an n-type conductivity or a p-type conductivity, or a metal via connection extending from the first surface to the second surface of the substrate. Furthermore, a metal contact can be provided at the second surface of the substrate.

In an embodiment of the invention a system is disclosed for plating on a plurality of conductive patterns formed at a surface of a substrate. Each conductive panel to be plated is temporarily electrically connected with a contact to the first surface of the substrate by a polysilicon conductor or an amorphous silicon conductor. Particularly, the conductive pattern is positioned on a first die and the corresponding contact is positioned on a second die different from said first die. Preferably said second die is adjacent to said first die to keep the polysilicon or amorphous silicon conductor as short as possible to minimize the resistance of the connection. Consequently the plating can be performed in a substantially uniform manner.

In another embodiment of the invention a system is disclosed for plating on a plurality of conductive patterns formed at a surface of a substrate, where at least a part of a conductive pattern and/or a contact to a first surface of a substrate is covered with a layer to inhibit plating on said part. Particularly this layer can be a resist layer (9). By doing so the usually undesired plating of a contact to the first surface of the substrate can be avoided.

The substrate can be a piece of a conductive material or a doped semi-conductive material. Particularly a silicon semiconductor wafer of a n-type or p-type conductivity can be used. The plating solution can be any commercially available plating solution. Of particular interest are plating solutions containing an element selected from a group comprising Ag, Cu, Au, Pt, Ti, Ni and Co. The conductive patterns are usually metal patterns. Particularly Al-containing or Cu-containing patterns can be used.

In another aspect of the invention, a substrate is disclosed having at least a first surface and a second surface opposite to said first surface, said first surface being exposable to a plating solution, said substrate comprising
   a conductive pattern being positioned at said first surface of a substrate;
   a contact to the first surface of the substrate; and
   said conductive pattern being temporarily electrically connected by a polysilicon or an amorphous silicon conductor with said contact and said contact being electrically connected with said second surface.

In a further aspect of the invention, a method is disclosed for plating on at least one conductive pattern formed at a surface of a substrate, said substrate having at least a first surface and a second surface, said method comprising the steps of:
   placing the substrate on an electrode being part of a plating holder such that said second surface of said substrate is in contact with said electrode and said conductive pattern is temporarily electrically connected to said conductive pattern; and
   applying a plating solution on said first surface of said substrate thereby inhibiting exposure of said second surface to said plating solution.

In another embodiment of the invention, a plating solution is disclosed wherein said electrode and said conductive pattern are temporarily electrically connected by forming a polysilicon or an amorphous silicon conductor to temporarily connect said conductive pattern with a contact to the substrate, said contact being formed on the first surface of the substrate, and by providing an electrical connection between said contact and said electrode. The resistance of the electrical connection between the contact and the electrode is substantially independent of the location of the contact on the first surface of the substrate. Therefore, to achieve a high degree of uniformity over the substrate of the plating process, preferably the length of the polysilicon or the amorphous silicon conductor should be kept as short as possible. On the other hand, one has to be able to easily cut the connection provided by the silicon or the amorphous silicon conductor after the plating process. Therefore, preferably, the conductive pattern is positioned on a first die and said contact is positioned on a second die different from said first die. By doing so, the connection can by cut by dicing the substrate. More preferably, said first and said second die are adjacent dies.

In another embodiment of the invention a method is disclosed, wherein prior to applying the plating solution, a resist layer is deposited on said conductive pattern and patterned in order to create at least one covered area an at least one uncovered area, said uncovered area being exposable to said plating solution.

Figure 2:
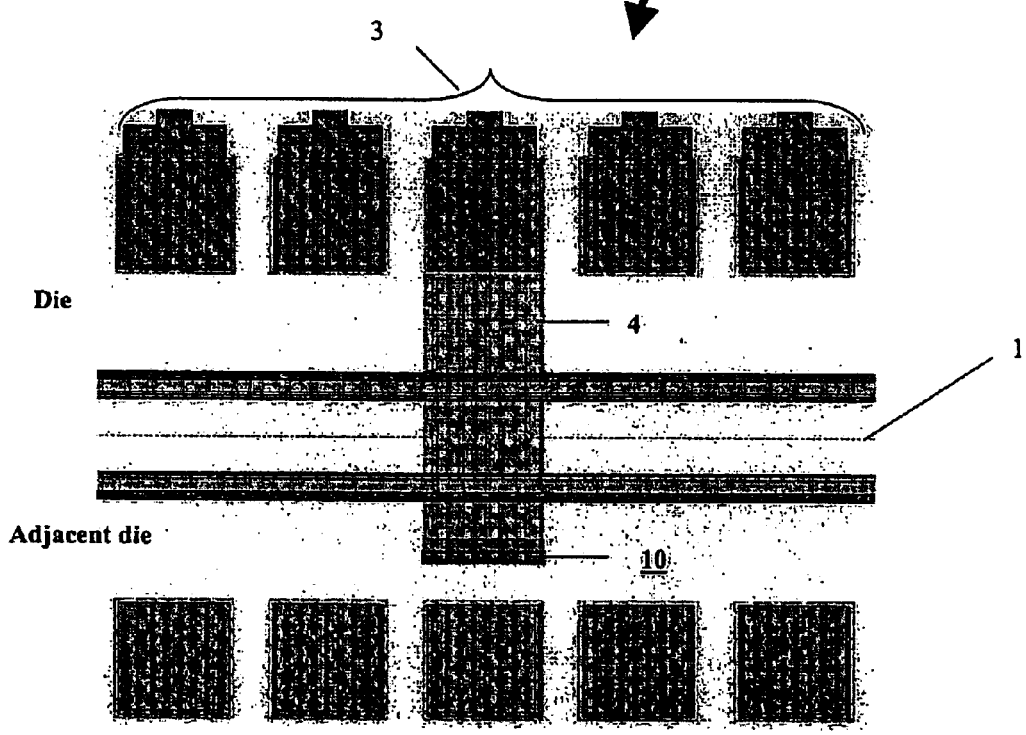
FIG. 2 is a magnified representation of a portion of FIG. 1 and shows a conductive pattern (3) of a first die, and a second die being adjacent. The polysilicon stripe (4) extends from said conductive pattern (3) over the dicing line (1) and is further connected to the substrate contact (10) on said second die.

In an embodiment of the invention, as an example, a system and a method for selectively electroplating a plurality of aluminum patterns is disclosed. The aluminum patterns to be plated are formed on the front side of a silicon wafer with a p-type conductivity. Each aluminum pattern (FIG. 1) to be plated is connected by means of a polysilicon line to an aluminum contact to the p-type substrate region of the wafer at the front side of the wafer. This contact is positioned on an adjacent die. The polysilicon line is isolated from the wafer by means of at least one dielectric layer (12). The polysilicon line extends over a dicing line (FIG. 2). Accordingly, all aluminum patterns to be plated are electrically connected to the back side of the wafer which can be provided with an aluminum metal contact.

Figure 3:
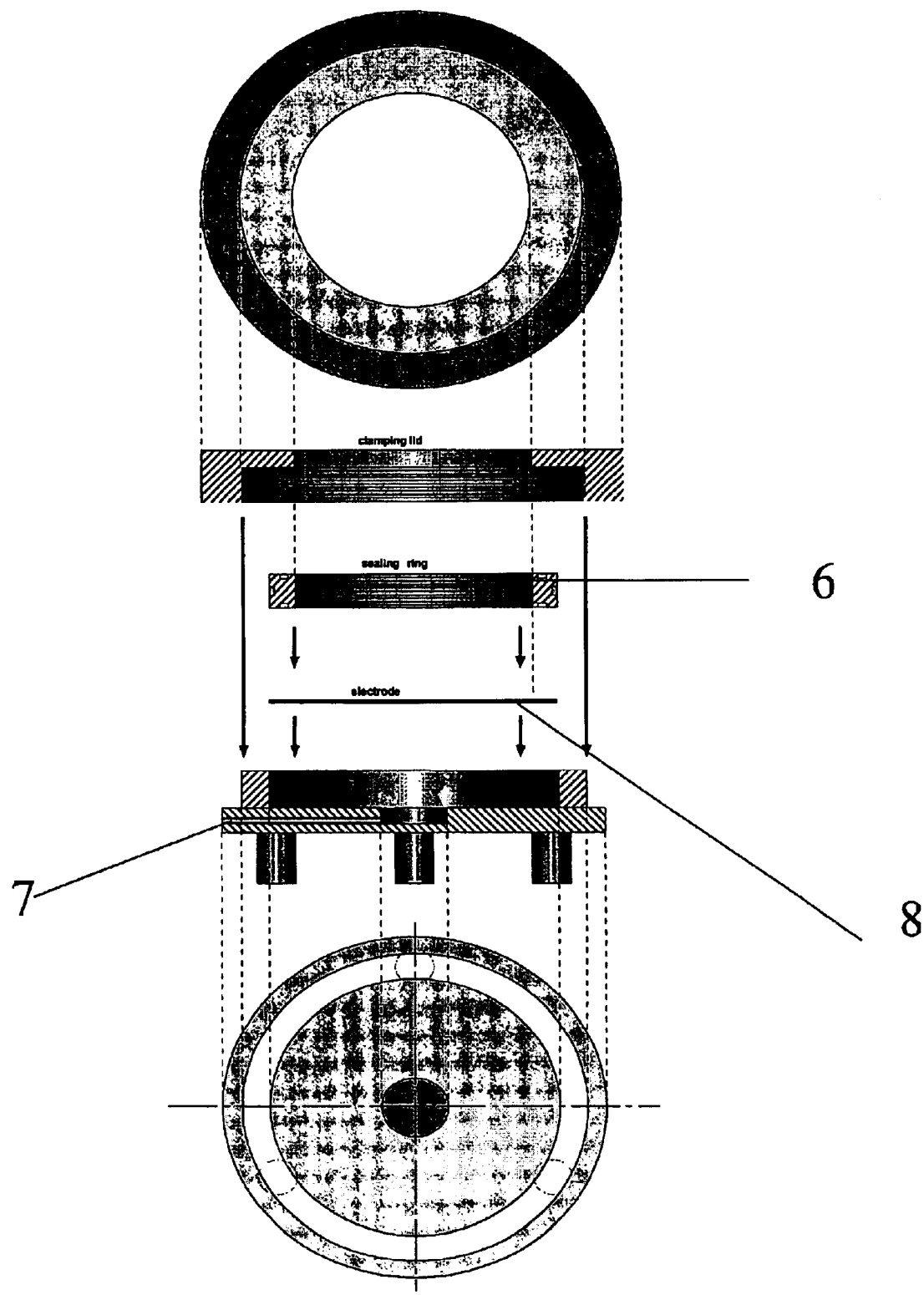
FIG. 3 shows a system for plating, comprising of a plating holder with a backside contact (8). Means for sealing (6), preventing the second surface of the wafer being exposed to the plating solution are foreseen. A backside contact means is also present (7).

Before applying a plating solution, the wafer is placed on a support with an electrically connectable electrode thereon such that there is an electrical connection between the back side of the wafer and the electrode. This support is a part of a wafer holder designed for plating purposes. During the plating process, the plating solution is brought in contact with the front side of the wafer, while the backside is sealed by means of a sealing element being part of the aforementioned wafer holder (FIG. 3). Particularly, this sealing element is a sealing ring which inhibits the exposure of the backside of the substrate to the plating solution The backside of the wafer is electrically connected with a backside electrode of the same size. By immersing a similar electrode as counter electrode in the plating solution, a homogeneous electrical field can be created. The plating process is galvanostatic, e.g. the current is held constant by regulating the potential between the backside and the counter electrode. According to the example, silver is electroplated and an alkaline silver solution is used as plating solution. A negative potential is applied at the backside electrode.

In order to avoid plating of the aluminum contacts to the substrate at the front side of the substrate, a positive photoresist layer (AZ4562) is used to cover those areas where no plating may occur.

Figure 4:
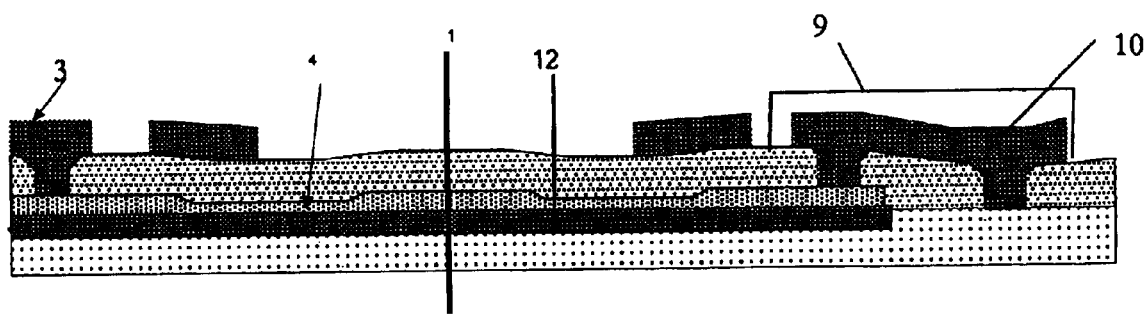
FIG. 4 shows a cross-section view of the polysilicon stripes. Dicing along the dicing line (1) over the polysilicon stripe (4), results in disconnecting the electroplated structures from the substrate contact (10).

Finally, the wafers are stripped and diced. FIG. 4 shows respectively a cross-section of the polysilicon lines. By dicing over the polysilicon lines, the electroplated structures are disconnected from the respective substrate contact.

By using the substrate as a contacting layer for an electrode, the electrical resistance between the areas to be plated and the electrical contact point is for all plated structures substantially the same, particularly if the length of the polysilicon lines is kept sufficiently short and the specific resistance of the polysilicon line is sufficiently low. This length has to be sufficiently short to assure that the resistance of the polysilicon lines has a negligible contribution to the total resistance of the connection between the conductive pattern and the backside of the wafer. Accordingly, the uniformity of the plating process is increased or in another words, the homogeneity of the deposited thickness of the plated material over the complete wafer is increased. In the example, the plated material is silver, By dicing over the polysilicon lines, the individual electroplated patterns are disconnected one from the other and are no longer in contact with the substrate. By using polysilicon or amorphous silicon lines extending over the dicing lines, the risk to create electroplated patterns, being short-circuited to the substrate after dicing is reduced. If metal lines or leads would be used to provide the connection to the contact extending over the dicing line, the electroplated patterns can still be in contact with the substrate after dicing due to metal shavings or residues.

The same plating system and method as defined according the present invention can be used for electrochemical chloridation on wafer scale provided that a different solution is used and a positive potential is applied at the backside electrode instead of a negative potential. Of particular interest is the electrochemical chloridation of silver. The electrochemical chloridation of bulk silver electrodes (wires) can be used for producing standard reference electrodes. An advantage is that the quality of the AgCl layer formed by using electrochemical chloridation is better than by using a chemical chloridation. So, according to the present invention, Ag/AgCl reference electrodes on wafer scale can be formed by using electroplated silver and electrochemically chloridized silver chloride.

What is claimed is:

1. A method for plating on at least one conductive pattern on a first side of a substrate and being electrically isolated from said substrate, said substrate having at least a first side and a second side, said method comprising the steps of:

placing the substrate on an electrode being part of a plating holder such that said second side of said substrate is in electrical contact with said electrode;

applying a plating solution on said first side of said substrate and inhibiting exposure of said second surface to said plating solution; and characterised in that said electrode and said conductive pattern are temporarily electrically connected by forming a polysilicon or an amorphous silicon conductor, which is insulated from said substrate and said plating solution, to temporarily connect said conductive pattern with a contact to the substrate, said contact being formed on the first side of the substrate, and by providing an electrical connection between said contact and said electrode.

2. A method as recited in claim 1, wherein said conductive pattern is positioned on a first die and said contact is positioned on a second die different from said first die.

3. A method as recited in claim 2, wherein after said conductive pattern is plated, said method further comprises the step of dicing the substrate.

4. A method as in claim 1, wherein prior to applying the plating solution, a resist layer is deposited on said conductive pattern and patterned in order to create at least one covered area and at least one uncovered area, said uncovered area being exposable to said plating solution.

5. A method as recited in claim 1, where said plating solution comprises an element selected from a group comprising Ag, Cu, Au, Pt, Ti, Ni and Co.

6. A substrate having at least a first surface and a second surface opposite to said first surface, said first surface being exposable to a plating solution, said substrate comprising a conductive pattern being positioned at said first surface of a substrate;

a contact to the first surface of the substrate; and said conductive pattern being electrically connected by a polysilicon or an amorphous silicon conductor with said contact and said contact being electrically connected with said second surface and said polysilicon or amorphous silicon conductor being isolated from said substrate.

* * * * *